United States Patent [19]

Weglein et al.

[11] 4,119,934
[45] Oct. 10, 1978

[54] BULK ACOUSTIC WAVE DELAY LINE

[75] Inventors: Rolf D. Weglein, Los Angeles; Michael T. Wauk, II, Palo Alto, both of Calif.

[73] Assignee: Hughes Aircraft Company, Culver City, Calif.

[21] Appl. No.: 795,352

[22] Filed: May 9, 1977

[51] Int. Cl.² .................. H03H 9/30; H03H 9/04
[52] U.S. Cl. ................. 333/30 R; 333/71; 333/72
[58] Field of Search ............ 333/30 R, 72, 29; 310/311, 322, 323, 325, 326, 327, 363–366

[56] References Cited

U.S. PATENT DOCUMENTS

| | | | |
|---|---|---|---|
| 2,859,415 | 11/1958 | Fagen | 333/30 R |
| 3,794,866 | 2/1974 | McElroy et al. | 310/327 |
| 3,942,139 | 3/1976 | Cooper et al. | 333/30 R |

*Primary Examiner*—Alfred E. Smith
*Assistant Examiner*—Marvin Nussbaum
*Attorney, Agent, or Firm*—John Holtrichter, Jr.; W. H. MacAllister

[57] ABSTRACT

A bulk acoustic wave delay line adapted to increase triple-transit signal suppression by selective aperture limiting, the device including a bulk acoustic wave-supporting body having a planar end face at each end of the bulk acoustic wave propagation path, the device also including an annular absorbing structure disposed on at least one of the end faces immediately adjacent to and surrounding a transducer for absorbing the portion of the propagating bulk acoustic wave energy impinging on an end face not covered by the transducer.

7 Claims, 4 Drawing Figures

BULK ACOUSTIC WAVE DELAY LINE

BACKGROUND OF THE INVENTION

The background of the invention will be set forth in two parts.

1. Field of the Invention

This invention relates to delay lines, and more particularly to bulk acoustic wave delay lines.

2. Description of the Prior Art

The usefulness of propagating elastic wave energy in solids has been known for many years. Utilizing this technology, such devices which store and delay signals have been developed to a relatively high degree. Many texts are presently available which thoroughly describe the history and advancements of this art, such as, for example, "Ultrasonic Methods in Solid State Physics" Rohn Truell, Charles Elbaum and Bruce B. Chick, Academic Press, 1969.

Probably the greatest interest in the field of bulk wave devices has been in bulk acoustic wave delay lines. Unlike surface acoustic wave delay lines in which most of the energy propagating along an elastic surface is converted to electromagnetic wave energy upon reaching a state of the art transducer, only about 10% of the propagating bulk wave energy is converted at an output transducer, the rest being reflected back toward the input transducer. This relatively strong reflected wave is again reflected at the input transducer and is incident on the output transducer to produce a relatively strong signal known generally as the triple-transit signal.

Although there was at first much interest in bulk acoustic wave devices because they are more adaptable for operation in the multi-gigahertz range as compared to surface acoustic wave devices (usually limited to about 500 MHz), the problem of the triple-transit signal has caused a decrease in such interest.

In attempts to overcome spurious multiple transit signal problems resulting from reflections from the crystal end faces, it has been found that these unwanted signals are attenuated or suppressed through careful design utilizing several effects:

A. Attenuation — if the main signal is attenuated $\alpha\tau$ dB, then the triple transit signal is attenuated an additional $2\alpha\tau$ dB.

B. Diffraction loss — due to spreading.

C. Tilting the end faces of the crystal to cause phase cancellation and beam walk-off.

D. Acoustic matching of the transducer in order to reduce the acoustic reflection.

Generally, all of these effects are utilized to some extent in order to obtain what has been considered to be a reasonable value of triple-transit suppression of 30 dB, where triple-transit suppression is defined as the ratio of the main delayed signal to the triple-transit spurious signal. It has now been determined that while diffraction loss in the main signal can be relatively large (20 to 30 dB, or more), the additional diffraction loss in the triple-transit signal, and hence the triple-transit suppression, is theoretically limited to 9.5 dB. This limit has been described in several articles, including one entitled "Today's Microwave Acoustic (Bulk Wave) Delay Line", in Microwave Journal, 13, March 1970, pp. 67–76, by Frank A. Olson; and an article by E. K. Sittig, "High Speed Ultrasonic Digital Delay Line Design", in Proc. IEEE, 56, July 1968, pp. 1194–1202.

SUMMARY OF THE INVENTION

In view of the foregoing factors and conditions characteristic of the prior art, it is a primary object of the present invention to provide an improved bulk acoustic wave delay line.

Another object of the present invention is to provide a bulk acoustic wave delay line with a reduced spurious triple-transit signal characteristic.

Still another object of the present invention is to provide a bulk acoustic wave delay line that utilizes selective diffraction loss techniques to suppress triple-transit signals as much as twice the main signal loss.

In accordance with the present invention, a bulk acoustic wave delay line includes a body of material capable of supporting acoustic wave energy propagating along a path within the body. The body of material including a planar end face at each of the propagation path, and a transducer is disposed on each of the planar end faces for converting electromagnetic wave energy to propagating bulk acoustic wave energy, and the converse thereof. The invention further includes aperture limiting means including bulk acoustic wave energy absorbing material disposed on at least one of the end faces immediately adjacent to and surrounding the transducer means for absorbing the portion of the propagating bulk acoustic wave energy impinging on an end face not covered by the transducer means.

The features of the present invention which are believed to be novel are set forth with particularity in the appended claims. The present invention, both as to its organization and manner of operation, together with further objects and advantages thereof, may best be understood by making reference to the following description taken in conjunction with the accompanying drawing in which like reference characters refer to like elements in the several views.

DESCRIPTION OF THE PREFERRED EMBODIMENT

Figure 1:
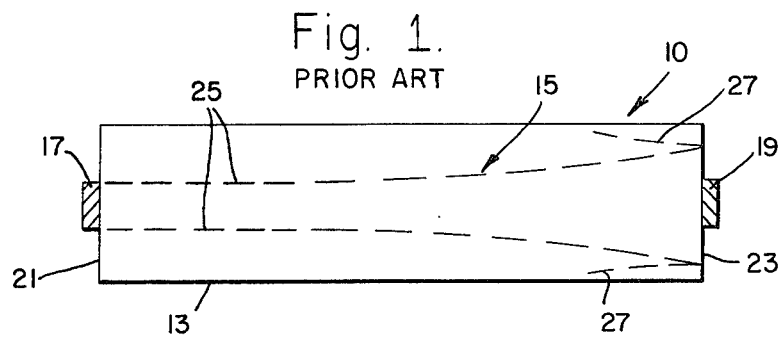
FIG. 1 is a schematic representation of a bulk acoustic wave delay line exemplifying the prior art.

Referring now to the drawing, and more particularly to FIG. 1, there is shown a conventional bulk acoustic wave delay line 11 in the form of a body 13 of material, such as sapphire, capable of supporting bulk acoustic wave energy propagating along a beam path 15 between a first transducer 17 and a second transducer 19, disposed on first and second planar end surfaces 21 nd 23, respectively.

This figure clearly illustrates typical beam spreading as the energy propagates from the first transducer 19 toward the second transducer 19 along a path defined by dashed lines 25. It can further be observed that energy is reflected by the entire second planar end surface 23, which eventually produces spurious triple-transit signals at the second output transducer 19.

As the beam reflects from the crystal ends 21 and 23, the beam spreading continues as shown by dashed lines 27, so that the diffraction loss to the triple-transit signal is consistent with a propagation loss three times the main delay loss. Since the beam spreading loss approaches an $X^2$ dependence, the triple-transit signal is additionally diffracted a maximum of $3^2$ or 9.5 dB.

Figure 2:
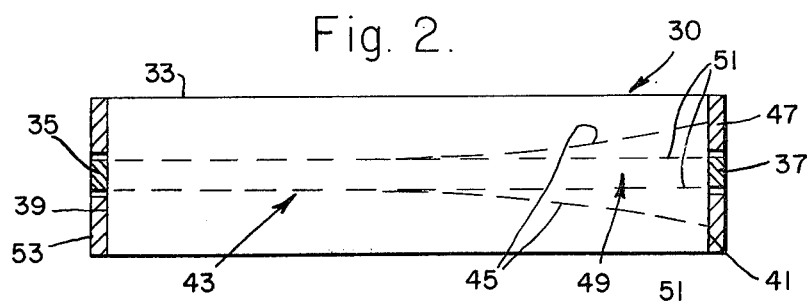
FIG. 2 is a schematic view of a bulk acoustic wave delay line incorporating aperature limiting, in accordance with an embodiment of the present invention.

In order to increase the diffraction loss experienced by the triple-transit signal energy over the loss of the main signal, the present invention includes a bulk acoustic wave energy absorbing layer on at least one of the planar ends of a bulk acoustic wave delay line 30 constructed in accordance with a presently preferred embodiment, and shown in FIG. 2. Here, a body 33 of sapphire, for example, is provided with conventional first and second transducers 35 and 37 at respective planar ends 39 and 41. Bulk acoustic wave energy generated by the first or input transducer 35 propagates toward the second or output transducer 37 along a diverging beam path 43, as illustrated by dashed lines 45. In order to limit reflections at the second end 41 to only that energy incident on the portion of the end 41 covered by the output transducer 37, an absorptive layer 47 is disposed on the second planar end surface 41. This layer completely surrounds the output transducer 37 so that reflected energy of the nature illustrated by dashed lines 27 in FIG. 1, are eliminated. Only the energy reflected at the transducer-covered portion of the end face 41 is reflected back toward the input transducer 35, along a relatively narrow path 49 shown by dashed lines 51 in FIG. 2.

In order to further enhance the reflected beam limiting technique of the present invention, an absorptive layer 53 is disposed on the first planar end surface 39 in such a manner as to completely surround the input transducer 35. In this way, only energy incident on that portion of the end surface 39 covered by the input transducer 35 is reflected back toward the output transducer 37 to create the triple-transit signal.

Figure 3:
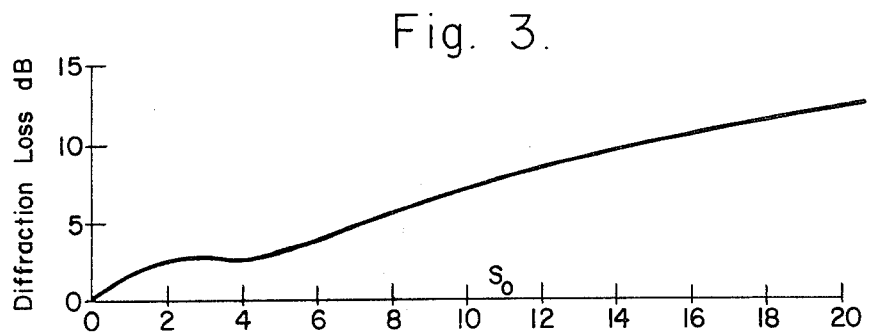
FIGS. 3 and 4 are graphic illustrations of computed diffraction loss and triple-transit suppression, respectively, in a bulk acoustic wave delay line constructed in accordance with the present invention.
Figure 4:
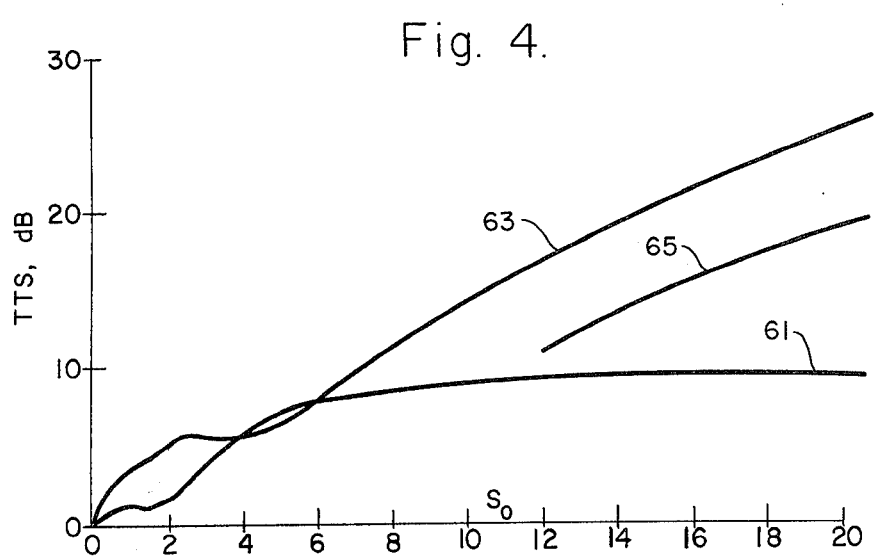

FIGS. 3 and 4, respectively, illustrate the diffraction loss and triple-transit spurious signal magnitude calculated for a bulk acoustic wave sapphire delay line versus a conventional parameter S. S is determined as follows:

$$S = \frac{778 \, \tau(\mu sec)}{f(GHz) \, D^2(mils^2)}$$

where $\tau$ is the delay time, $f$ is the frequency, and D is the beam aperture. Referring to FIG. 4, it can be seen from curve 61 (no aperture limiting) that while a conventional bulk acoustic wave delay line having no aperture limiting may exhibit a beam spread loss as high as 20 to 30 dB, or more, the maximum triple-transit signal suppression contributed by this spreading, can only be about 9.5 dB.

If, however, the aperture of the reflected beams is limited by the absorption layers 47 and 53 to the diameter of the transducers, then the spreading will increase so that the beam spreading loss is the same for each propagation. The triple-transit signal suppression will then be increased to as much as twice the loss value for the main signal with no change in the main delayed signal loss. This is illustrated by curves 63 and 64 in FIG. 4 for two values of DD of 1.0 and 1.1 respectively, where DD is the inside diameter of the aperture in the absorptive layer 47 divided by the outside diameter of the transducer 37.

The reflective-aperture-limiting layers 47 and 53 are designed to absorb and effectively terminate the beam energy outside the limits of the transducers. A suitable layer may be a silver or gold film plated to a thickness of a few thousandths of an inch, ~0.002 for example.

As suggested by the relationship of the curves 63 and 65 in FIG. 4, the closer the absorptive layers 47 and 53 come to the outside diameter of their associated transducers, the higher the triple transit suppression. This suggests the use of a high resolution technique such as photolithography or an equivalent technology to achieve the desired precision.

The invention also allows the use of acoustic matching at the transducers as a means of triple transit suppression. For the reduced acoustic reflection from the transducer to be effective in triple-transit signal suppression, it is necessary that the reflection outside the transducer also be reduced. For a typical case of 2.5 $\mu$sec sapphire delay line operating at 3 GHz with an intial beam diameter of 8 mils, the beam spreads to about twice its initial diameter. The aperture limiting technique of the present invention will terminate the energy outside the transducers, so that the reflected bulk acoustic wave beam is limited to that from the transducers alone.

From the foregoing, it should be evident that the present invention provides a bulk acoustic wave delay line that incorporates a highly advantageous technique to limit the reflected energy apertures to the size of the transducers and thus increase the loss experienced by reflected energy as compared to the main beam energy.

It should also be understood that although certain specific materials and embodiments have been described in detail, other materials and embodiments exhibiting similar characteristics and following the teachings of the invention may be utilized and constructed within the scope and contemplation of the invention.

What is claimed is:

1. A bulk acoustic wave delay line, comprising:
    a body of material capable of supporting bulk acoustic wave energy propagating along a path within said body, said body of material including a planar end face at each end of said path;
    transducer means including a circular input transducer disposed one one of said planar end faces and a circular output transducer disposed on the other of said planar end faces for respectively converting electromagnetic wave energy to said propagating bulk acoustic wave energy and the converse thereof; and
    aperture limiting means including an annular layer of bulk acoustic wave absorbing material disposed on at least one of said end faces immediately adjacent to and surrounding an associated one of said transducers for absorbing the portion of said propagating bulk acoustic wave energy impinging on said end face not covered by said associated transducer.

2. The bulk acoustic wave delay line according to claim 1, wherein said aperture limiting means includes an annular layer of bulk acoustic wave absorptive material surrounding each of said transducers.

3. The bulk acoustic wave delay line according to claim 1, wherein said aperture limiting means includes a layer of silver.

4. The bulk acoustic wave delay line according to claim 1, wherein said aperture limiting means includes a layer of gold.

5. The bulk acoustic wave delay line according to claim 1, wherein said aperture limiting means includes a layer of bulk acoustic wave material having a thickness on the order of two thousandths of an inch.

6. The bulk acoustic wave delay line according to claim 1, wherein said aperture limiting means includes at least one annular layer of bulk acoustic wave absorption layer having an inside diameter of a relationship to the outside diameter of said transducer of at least approximately 1.1.

7. The bulk acoustic wave delay line according to claim 6, wherein said transducers and said absorption layer are fabricated using photolithographic technology.

* * * * *